United States Patent [19]

Franssen

[11] 4,064,505
[45] Dec. 20, 1977

[54] SIGNAL TRANSMISSION CIRCUIT COMPRISING A CODER AND A DECODER

[75] Inventor: Nico Valentinus Franssen, Eindhoven, Netherlands

[73] Assignee: U.S. Philips Corporation, New York, N.Y.

[21] Appl. No.: 587,637

[22] Filed: June 17, 1975

Related U.S. Application Data

[63] Continuation of Ser. No. 288,105, Sept. 11, 1972, abandoned.

[30] Foreign Application Priority Data

Sept. 30, 1971  Netherlands ..................... 7113389

[51] Int. Cl.² .................. H04M 1/19; H04K 1/06
[52] U.S. Cl. ................ 340/347 DD; 179/1.5 S; 333/70 T
[58] Field of Search ............ 340/347 DD; 325/40–42; 333/28, 70 T; 179/1.5 S, 1.5 C, 1.5 R, 1.5 FS, 1 J

[56] References Cited

U.S. PATENT DOCUMENTS 3,225,142  12/1965  Schroeder .................. 179/1.5 C
3,631,232  12/1971  Perreault et al. ............ 333/70 T

*Primary Examiner*—Malcolm A. Morrison
*Attorney, Agent, or Firm*—Frank R. Trifari; Simon L. Cohen

[57] ABSTRACT

A coder and a decoder having delay elements of the same delay time arranged one after the other in which the signal transmission ratio code of the signal paths from the input of the circuit to the output is chosen in accordance with bessel coefficients so as to prevent disturbing echoes.

2 Claims, 1 Drawing Figure

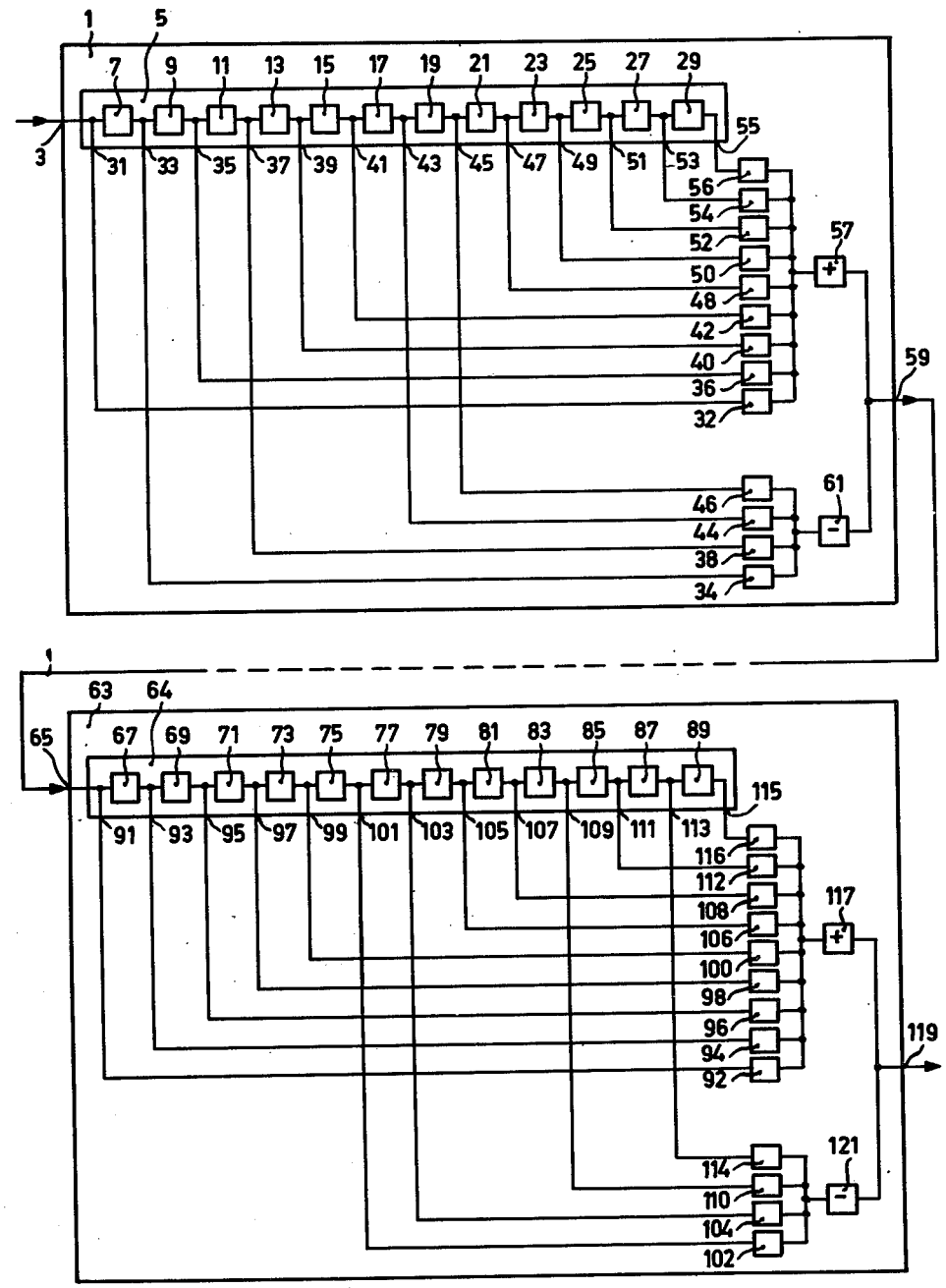

SIGNAL TRANSMISSION CIRCUIT COMPRISING A CODER AND A DECODER

This is a continuation of application Ser. No. 288,105, filed Sept. 11, 1972, now abandoned.

The invention relates to a signal transmission system comprising a coder or a decoder respectively which system includes a delay circuit having a number of signal delay elements of substantially equal delay time arranged one after the other between taps, a number of signal paths leading from an input of the coder through the taps and transmission circuits to an output of the coder or the decoder, which signal paths exhibit a transmission ratio code.

A signal transmission circuit of the kind described above is known from United Kingdom Patent Specification 1,016,284 in which the transmission ratio code of the signal paths in the coder of the transmission factor of the signal paths through the $n^{th}$ tap to that through the first is equal to $-(1-g^2)g^{n-2}k^{n-1}$ and exhibits a mirrored sequence in the decoder. A signal coded and decoded according to this method has one or more interfering unwanted echoes.

The object of the invention is to provide a signal transmission system comprising a coder and a decoder, which does not substantially have this drawback and yet has a linear amplitude characteristic.

According to the invention a signal transmission circuit of the kind described in the preamble is characterized in that the transmission ratio code is a ratio in accordance with bessel coefficients $J_k(x)$, the delay circuit has $2n$ delay elements while $k = 0$ for the signal path through the tap between the $n^{th}$ and the $(n+1)^{th}$ delay element, $k$ is successively $1, 2, \ldots n$ in the coder for the signal paths through the tap at the output of the $(n+1)^{th}$, $(n+2)^{th}, \ldots 2n^{th}$ element and $k$ is successively $-1, -2, \ldots -n$ for the signal paths through the taps at the input of the $n^{th}$, $(n-1)^{th}, \ldots 1^{st}$ element, the argument $x$ of the said bessel coefficients being equal while in the respective decoder the sequence of the indices $k$ is in reverse to the tap for which $k = 0$ and the arguments $x$ are equal to those of the corresponding coder.

The invention will now be described with reference to the drawing.

The drawing which has one FIGURE only illustrates by means of a block diagram a signal transmission circuit having a coder and a decoder according to the invention.

In the drawing a coder 1 has an input 3 to which a video or an audio signal can be applied. The input 3 is connected to an input of a delay circuit 5 which has a number of delay elements 7, 9, 11, 13, 15, 17, 19, 21, 23, 25, 27 and 29 arranged one after the other. These delay elements are included between taps 31, 33, 35, 37, 39, 41, 43, 45, 47, 49, 51, 53 and 55 which are connected to transmission circuits, for example, resistive networks 32, 34, 36, 38, 40, 42, 44, 46, 48, 50, 52, 54 and 56, respectively. The delay elements each have a delay time $\tau$ which is adapted to the signal to be handled in which $\tau$ for a video signal is preferably chosen to be at least equal to the period corresponding to some image elements and for an audio signal preferably at least some tenths of a second.

The outputs of resistive networks 32, 36, 40, 42, 48, 50, 52, 54 and 56 are connected through an amplifier 57 to an output 59 of the coder 1 and the resistive networks 34, 38, 42, 44 and 46 are connected through an amplifier 61.

The amplifiers 57 and 61 have a positive and a negative amplification factor, respectively, that is to say, they do not provide a phase inversion and provide a phase inversion, respectively, of the signals applied thereto.

The different signal paths from the input 3 through the taps 31, 33, 35, 37, 39, 41, 43, 45, 47, 49, 51, 53 and 55 are referenced $-k, -(k-1), \ldots -2, -1, 0, 1, 2 \ldots (k-1), k$ in which $k$ in this case $= 6$. The code of the transmission ratio in the successive signal paths is $J_k(x)$ according to bessel coefficients in which $x$ is chosen to be equal for all signal paths.

It has been found that for this choice there are substantially no disturbing echoes after decoding in a corresponding decoder 63 and this to a lesser extent as the argument $x$ of the bessel coefficients $J_k(x)$ is chosen to be smaller relative to $k_{max}$ in which $k_{max} = n$ in which $n$ = half the number of delay elements. The number of delay elements is chosen to be even and is thus equal to $2n$ in which $n$ is an integer. A favourable value of $x$ in which the first and the last delay elements still give a reasonable contribution to coding and in which the disturbing echo amplitude is still very small is for $x = k_{max} - 2$. In case of larger values of $x$ the echoes are increasingly noticeable. For the relevant signal paths in this example the transmission ratio code for $k_{max} = 6$ and $x = k_{max} - 2$ is as follows:

| signal paths | k | $J_k(x)$ |
|---|---|---|
| 3,31,32,57,59 | −6 | $J_{-6}(4) = + 0.0491$ |
| 3,33,34,61,59 | −5 | $J_{-5}(4) = - 0.1321$ |
| 3,35,36,57,59 | −4 | $J_{-4}(4) = + 0.2811$ |
| 3,37,38,61,59 | −3 | $J_{-3}(4) = - 0.4302$ |
| 3,39,40,57,59 | −2 | $J_{-2}(4) = + 0.3641$ |
| 3,41,42,57,59 | −1 | $J_{-1}(4) = + 0.0660$ |
| 3,43,44,61,59 | 0 | $J_0(4) = - 0.3971$ |
| 3,45,46,61,59 | 1 | $J_1(4) = -0.0660$ |
| 3,47,48,57,59 | 2 | $J_2(4) = + 0.3641$ |
| 3,49,50,57,59 | 3 | $J_3(4) = + 0.4302$ |
| 3,51,52,57,59 | 4 | $J_4(4) = + 0.2811$ |
| 3,53,54,57,59 | 5 | $J_5(4) = + 0.1321$ |
| 3,55,56,57,59 | 6 | $J_6(4) = + 0.0491$ |

The disturbing echoes then remain 36 dB below the decoded desired signal value.

The decoder 63 has an input 65 which is connected to a delay circuit 64 having a number of delay elements 67, 69, 71, 73, 75, 77, 79, 81, 83, 85, 87, 89 arranged one after the other. The delay circuit 64 has a number of taps 91, 93, 95, 97, 99, 101, 103, 105, 107, 109, 111, 113 and 115 between which the successive delay elements are arranged. The delay elements have delay times $\tau$ which are mutually equal and are equal to those of the delay elements of coder 5.

The said taps are connected to transmission circuits, for example, resistive networks 92, 94, 96, 98, 100, 102, 104, 106, 108, 110, 112, 114 and 116, respectively. The outputs of the resistive networks 92, 94, 96, 98, 100, 106, 108, 112 and 116 are connected through an amplifier 117 to an output 119 of the decoder 63 and those of the resistive networks 102, 104, 110 and 114 are connected through an amplifier 121. The amplifiers 117 and 121 have an amplification factor of opposite sign.

For the different signal paths from the input 65 to the output 119 the following transmission ratio code for $x = 4$ applies:

| Signal paths | k | $J_k(x)$ |
|---|---|---|
| 65,91,92,117,119 | 6 | $J_6(4) = + 0.0491$ |
| 65,93,94,117,119 | 5 | $J_5(4) = + 0.1321$ |
| 65,95,96,117,119 | 4 | $J_4(4) = + 0.2811$ |
| 65,97,98,117,119 | 3 | $J_3(4) = + 0.4302$ |
| 65,99,100,117,119 | 2 | $J_2(4) = + 0.3641$ |
| 65,101,102,121,119 | 1 | $J_1(4) = - 0.0660$ |
| 65,103,104,121,119 | 0 | $J_0(4) = - 0.3971$ |
| 65,105,106,117,119 | −1 | $J_{-1}(4) = + 0.0660$ |
| 65,107,108,117,119 | −2 | $J_{-2}(4) = + 0.3641$ |
| 65,109,110,121,119 | −3 | $J_{-3}(4) = - 0.4302$ |
| 65,111,112,117,119 | −4 | $J_{-4}(4) = + 0.2811$ |
| 65,113,114,121,119 | −5 | $J_{-5}(4) = - 0.1321$ |
| 65,115,116,117,119 | −6 | $J_{-6}(4) = + 0.0491$ |

The $k$-enumeration of the signal paths is thus in reverse to that in the coder.

It will be evident that the delay elements may be formed, if desired, by registration medium trajectories such as, for example, magnetic tape trajectories along which converters, for example, pick-up and play-back heads are arranged at suitable distances.

What is claimed is:

1. A signal transmission system comprising a coder, a decoder, means serially connecting the coder to the decoder, a separate delay circuit having a number of signal delay elements of substantially equal delay times arranged one after the other between taps in the encoder and decoder, the period of each delay being substantially greater than a period of the lowest frequency signal to be transmitted, at least two transmission circuits in the encoder and decoder for combining signals passing through the taps in the respective delay circuits thereof, a number of signal paths leading from an input of the coder through the taps and transmission circuits thereof to an output of the coder, a corresponding number of signal paths leading from an input of the decoder through the taps and transmission circuits thereof to an output of the decoder, which signal paths in both the encoder and decoder exhibit a sequence of transmission ratios in successive signal paths along the delay circuits hereinafter called transmission ratio code, the transmission ratio code being a ratio in accordance with bessel coefficients $J_k(x)$, each delay circuit having $2n$ delay elements while $k = 0$ for the signal path through the tap between the $n^{th}$ and the $(n+1)^{th}$ delay element $k$ is successively $1, 2 \ldots n$ in the coder for the signal paths through the tap at the output of the $(n+1)^{th}$, $(n+2)^{th}$, $\ldots 2n^{th}$ element and $k$ is successively $-1, -2, \ldots -n$ for the signal paths through the taps at the input of the $n^{th}$, $(n-1)^{th}, \ldots 1^{st}$ element, the argument $x$ of the said bessel coefficients being mutually equal while in the respective decoder the sequence of the indices $k$ is the reverse of the sequence in the encoder and the arguments $x$ are equal to those of the corresponding order.

2. A signal transmission circuit as claimed in claim 1, wherein the argument $x$ of the bessel coefficients $J_k(x)$ of both the encoder and decoder is at most equal to $n-2$.

* * * * *

UNITED STATES PATENT AND TRADEMARK OFFICE
CERTIFICATE OF CORRECTION

PATENT NO. : 4064505
DATED       : Dec. 20, 1977
INVENTOR(S) : NICO VALENTINUS FRANSSEN

It is certified that error appears in the above-identified patent and that said Letters Patent are hereby corrected as shown below:

Column 4, line 24, "order" should be --coder--

Signed and Sealed this

Ninth Day of May 1978

[SEAL]

Attest:

RUTH C. MASON
Attesting Officer

LUTRELLE F. PARKER
Acting Commissioner of Patents and Trademarks